United States Patent
Kiser

(10) Patent No.: US 9,618,551 B2
(45) Date of Patent: Apr. 11, 2017

(54) CALIBRATION OF STEP ATTENUATOR

(71) Applicant: NATIONAL INSTRUMENTS CORPORATION, Austin, TX (US)

(72) Inventor: Jon R. Kiser, Austin, TX (US)

(73) Assignee: NATIONAL INSTRUMENTS CORPORATION, Austin, TX (US)

(*) Notice: Subject to any disclaimer, the term of this patent is extended or adjusted under 35 U.S.C. 154(b) by 294 days.

(21) Appl. No.: 14/318,401

(22) Filed: Jun. 27, 2014

(65) Prior Publication Data
US 2015/0381139 A1 Dec. 31, 2015

(51) Int. Cl.
G01R 27/28 (2006.01)
H03H 7/24 (2006.01)
G01R 35/00 (2006.01)
H01P 1/22 (2006.01)

(52) U.S. Cl.
CPC ........... *G01R 27/28* (2013.01); *G01R 35/00* (2013.01); *H01P 1/22* (2013.01); *H03H 7/24* (2013.01)

(58) Field of Classification Search
CPC .......... H03H 7/24; G01N 29/11; G01R 27/28; G01R 31/2822; G01R 19/0007; G01R 35/00; H01P 1/22

USPC .................. 333/17.1, 17.3, 81 R; 73/599
See application file for complete search history.

(56) References Cited

U.S. PATENT DOCUMENTS 6,091,247 A * 7/2000 Liu .................. G01R 35/005
324/601

* cited by examiner

*Primary Examiner* — Benny Lee
*Assistant Examiner* — Albens Dieujuste
(74) *Attorney, Agent, or Firm* — Meyertons Hood Kivlin Kowert & Goetzel, P.C.; Jeffrey C. Hood; Mark S. Williams

(57) ABSTRACT

System and method for calibrating a step attenuator. N attenuation measurements of a step attenuator may be received, where the step attenuator includes M series-connected attenuation sections. Each attenuation section may be configured to switchably provide a respective level of attenuation, where N is greater than M, and where the step attenuator may be modeled via M+1 coefficients, including a coefficient for a no-attenuation state and respective coefficients for the attenuation sections. Values of the coefficients may be determined via least squares estimation using the N attenuation measurements, thereby calibrating the step attenuator.

20 Claims, 12 Drawing Sheets

CALIBRATION OF STEP ATTENUATOR

FIELD OF THE INVENTION

The present invention relates to the field of attenuators, and more particularly to a system and method for calibrating step attenuators.

DESCRIPTION OF THE RELATED ART

Step attenuators are devices or components that operate to switchably attenuate (decrease) signal amplitude in precise steps, i.e., that can apply multiple discrete levels of attenuation via switching.

Traditional methods for calibration of step attenuators require characterization of the frequency response (loss versus frequency) through the attenuator for every attenuation step setting. This is a time consuming process, generally taking many hours to perform, and can suffer from inaccuracy at low attenuation settings due to mismatch uncertainty, and inaccuracy at high attenuation owing to poor signal-to-noise ratio (SNR) during calibration. At high attenuation settings, the time required to achieve an accurate calibration can be quite long because increased averaging is required to compensate for poor SNR.

SUMMARY OF THE INVENTION

Various embodiments of a system and method for calibrating step attenuators are presented below.

The method may be performed by host computer, or by a device, e.g., a microwave signal generator, spectrum analyzer, etc., that includes a step attenuator itself.

N attenuation measurements of a step attenuator may be received. The step attenuator may include M series-connected attenuation sections, where each attenuation section is configured to switchably provide a respective level of attenuation (of a signal). Note that N and M are integers, and that N is greater than M. In other words, for a given number of attenuation steps in the step attenuator, a greater number of measurements are received. Note further that the labels used herein, e.g., "N", "M", "k", "b", etc., may be referred to via any other labels as desired; the particular letters and references used are for convenience and convention only.

The step attenuator may be modeled via M+1 coefficients, including a coefficient for a no-attenuation state and respective coefficients for the attenuation sections. The no-attention state refers to the state in which all the attenuation steps are inactive, e.g., are turned off. Note that in general this state still provides some attenuation, specifically, the minimum level that is inherent to the step attenuator and/or the device that includes the step attenuator.

Values of the coefficients may be determined via least squares estimation using the N attenuation measurements, thereby calibrating the step attenuator. Said another way, having at least as many attenuation measurements as there are coefficients allows the method to determine values of the coefficients based on the attenuation measurements. Determining these coefficient values may thus calibrate the step attenuator (at least for a given frequency).

In some embodiments, the receiving and determining may be performed for a respective input signal at each frequency of a plurality of frequencies. In other words, the receiving and determining may be performed for each of multiple frequencies to calibrate the step attenuator over a range of frequencies, e.g., over the operational frequency range of the step attenuator (and/or device that contains the step attenuator).

Any of various types of step attenuator may be calibrated using embodiments of the techniques disclosed herein, e.g., both mechanical and solid-state step attenuators. In one embodiment, a step attenuator may use mechanical contacts but be actuated electronically using solenoids. Other attenuators contemplated may be entirely solid state, mechanical, electrical, or electronic, devices, and/or any of various combinations of electrical, electronic, mechanical, and/or solid state elements or components, among others.

Respective sections of the step attenuator may be engaged by discrete digital signals which collectively form a binary control word (or binary attenuation index. In some embodiments, the step attenuator may be controlled by an M-bit binary control index, where each bit is a respective binary (two-valued, e.g., zero or one) attenuation index, and where M binary attenuation indices, e.g., $b_1$-$b_M$, respectively control the M attenuation sections. In some embodiments, the binary control index may be implemented as an M-bit "word", although in other embodiments, any data structure or representation may be used as desired. Each bit (or binary attenuation index) may control a respective attenuation step, where $b_1$ controls the first attenuation step, $b_2$ controls the second attenuation step, and so forth. In the exemplary case of a four step attenuator, $b_1 \ldots b_4$ represent the four individual bits in a binary representation of the index (where bit values are either 0 or 1), the coefficients $k_1 \ldots k_4$ represent the change in signal loss when the sections or steps are individually activated (in dB), and $k_0$ represents the signal loss of the no-attenuation (index=0) state. In this exemplary case, the nominal attenuations for the sections are 5 dB, 10 dB, 20 dB, and 40 dB, allowing a total attenuation range of 0-75 dB in 5 dB steps, and the number of attenuation measurements N is at least 5.

Accordingly, in one embodiment, the method may include modeling the step attenuator as a linear combination of attenuation terms for the respective attenuation sections or steps, e.g.:

$$L(\text{index}) = k_0 + k_1 * b_1 + k_2 * b_2 \ldots k_M * b_M,$$

where $k_0$-$k_M$ are the M+1 coefficients, and L represents an attenuation measurement. This expression may be expressed more compactly as:

$$\text{vector } b * \text{vector } k = \text{vector } L.$$

Thus, the (modeled) contribution of each attenuation step is represented as a product of the respective binary control index and the corresponding coefficient, where a binary control index value of zero nullifies the product, and a value of one results in a step attenuation value of the respective coefficient. As explained above, the coefficient $k_0$ represents the inherent or residual attenuation in effect when all of the attenuation steps are inactive, e.g., the "zero state". Thus, when all the binary control indices are zero, L is equal to $k_0$. In other words, $k_0$ represents the inherent attenuation of the zero state.

In some embodiments, determining the values of the coefficients may include solving a system of linear equations defined by an augmented control matrix, a coefficient vector k, and a measured attenuation vector L, e.g.:

$$\begin{bmatrix} 1 & b_{01} & b_{02} & \ldots & b_{0M} \\ 1 & b_{11} & \ldots & \ldots & b_{1M} \\ \ldots & \ldots & \ldots & \ldots & \ldots \\ \ldots & \ldots & \ldots & \ldots & \ldots \\ 1 & b_{N1} & b_{N2} & \ldots & b_{NM} \end{bmatrix} \begin{bmatrix} k_0 \\ k_1 \\ \ldots \\ \ldots \\ k_M \end{bmatrix} = \begin{bmatrix} L_0 \\ L_1 \\ \ldots \\ \ldots \\ L_N \end{bmatrix},$$

where each matrix row specifies a respective activation pattern of the attenuation sections, where at least M+1 of the linear equations are linearly independent, and where $L_i$ is a respective attenuation measurement, i.e., measured "loss" value, M is the number of attenuator steps or stages, and N is the number of measurements. Said another way:

matrix $b_{MN}$*vector $k_M$=vector $L_N$.

The term "augmented" refers to the leftmost column of the control matrix, whose values are all 1, and which corresponds to the zero state attenuation contribution of each activation pattern. Note, for example, that for each activation pattern (row), setting all the control bits to zero (or off) results in the expression $k_0=L_0$, as noted above.

Following the exemplary use case mentioned above, the four control bits allow 16 individual states (activation states) of the step attenuator, each state corresponding to a respective pattern of the bit values, and the attenuation L at each of these states can be measured. Now, in the exemplary case of the four-step attenuator, there are five unknown coefficients $k_0 \ldots k_4$—one for each bit, and one for the zero state, as mentioned above, so a minimum of five measurements are needed to solve for the coefficients. When more than five measurements are used, the system of equations is over-determined.

More generally, when N is greater than M+1, the system of linear equations is over-determined. In other words, when more measurements are used, the number of rows in the matrix and L vector may increase accordingly. Note that with only M+1 (e.g., five in the present example) measurements, b is a square matrix and may potentially be inverted directly, giving a solution as vector $k=b^{-1}*L$, but if additional measurements are made, there are more measurements than unknowns, b is no longer a square matrix, $b^{-1}$ is undefined and the system is over-determined. However, the same equations that solve the least-squares solution for the over-determined system still work if the number of measurements is reduced to the minimum of 5.

In one embodiment, the least-squares solution for the system of equations may be found as follows:

matrix $b$*vector $k$=vector $L$, (matrix $b^T$*matrix $b$)*vector $k$=(matrix $b^T$)*vector $L$, vector $k$=(matrix $b^T$*matrix $b$)$^{-1}$*(matrix $b^T$)*vector $L$, where superscript T denotes "transpose" of the matrix.

Since the attenuator section's loss are generally not constant as a function of frequency, in some embodiments, the k vector values may be calculated for each discrete frequency at which calibration data (measured L values) is collected. In other words, the receiving and determining may be performed for each of multiple frequencies to calibrate the step attenuator over a range of frequencies, e.g., over the operational frequency range of the step attenuator (and/or device that contains the step attenuator).

Note, however, that the value of the matrix "(matrix $b^T$*matrix b)$^{-1}$*(matrix $b^T$)" is constant for a particular set of measured attenuation states. The coefficients at each new frequency may thus be determined by multiplying each new vector of measured data L, by the already calculated "(matrix $b^T$*matrix b)$^{-1}$*(matrix $b^T$)", providing for efficient computation. Additional computational optimization may be obtained for a given "(matrix $b^T$*matrix b)$^{-1}$*(matrix $b^T$)" if so desired, e.g., by "unrolling" the matrix multiplication into its component values and omitting the products where the $b_{ij}$ values are zero. This optimization may need to be customized for any particular set of measured states, but may provide for fastest execution by eliminating unnecessary multiplication and addition instructions.

Note that while the above discussion has tacitly presumed that the measured L values are attenuator loss, the measurements that can actually be accessed during calibration may not be simply the step attenuator's loss, but may instead be the loss or attenuation of an entire device in which the step attenuator is included, e.g., may reflect the entire device's, e.g., a downconverter's, response.

Note that the above model still applies in the same way, but the value of the vector L represents the complete device (e.g., downconverter) response, not just the step attenuator. The additional response attributable to other parts of the device (including any inherent losses of the step attenuator in the zero state) simply gets incorporated into the value of $k_0$. Thus, in some embodiments, the step attenuator may be included in a device, where $L_i$ is a respective attenuation measurement for the device, including the step attenuator.

In various embodiments of the above techniques, any number of measurements>=M+1 (e.g., greater than or equal to 5, in the exemplary case described) may suffice, depending upon the chosen states. However, poorly chosen combinations of attenuation states may result in an ill-conditioned system and no (good) solution. Accordingly, particular activation states used may be chosen such that this is not the case. Said another way, activation patterns may be selected to produce a well-conditioned matrix.

Referring again to the exemplary case above, since the system of equations is over-determined with more than 5 measurements, some of the possible activation states may be omitted (e.g., from the measurements). This may be advantageous from at least two perspectives: first, for low attenuation values, especially at 0 dB, but also to some degree at 5 dB, there may be significant microwave mismatch (and therefore increased measurement uncertainty) resulting from mediocre input return loss (RL), e.g., of a first mixer interacting with the signal source used for calibration, and so omitting the low attenuation states may reduce the impact of the mixer RL; second, at very high attenuation, the signal level available, e.g., at a digitizer, is low, and so considerable averaging (and therefore time) may be needed to reduce noise and achieve acceptable accuracy. Accordingly, omitting measurements at the 0, 5, 65, 70, and 75 dB settings therefore may have the potential to both reduce test time, and at the same time increase the accuracy of the calibration, a rare example of doing less to get better results.

More generally, in some embodiments, the step attenuator may be configurable to provide a range of attenuation values, where the attenuation measurements are made at respective attenuation values of the step attenuator within a specified sub-range of the range. For example, in one embodiment, the sub-range may omit at least one lowest value of the range. In another embodiment, the sub-range may omit at least one highest value of the range. Of course, in further embodiments, the sub-range may omit one or more values at both the lowest and highest values of the range.

BRIEF DESCRIPTION OF THE DRAWINGS

A better understanding of the present invention can be obtained when the following detailed description of the preferred embodiment is considered in conjunction with the following drawings, in which.

Figure 1A:
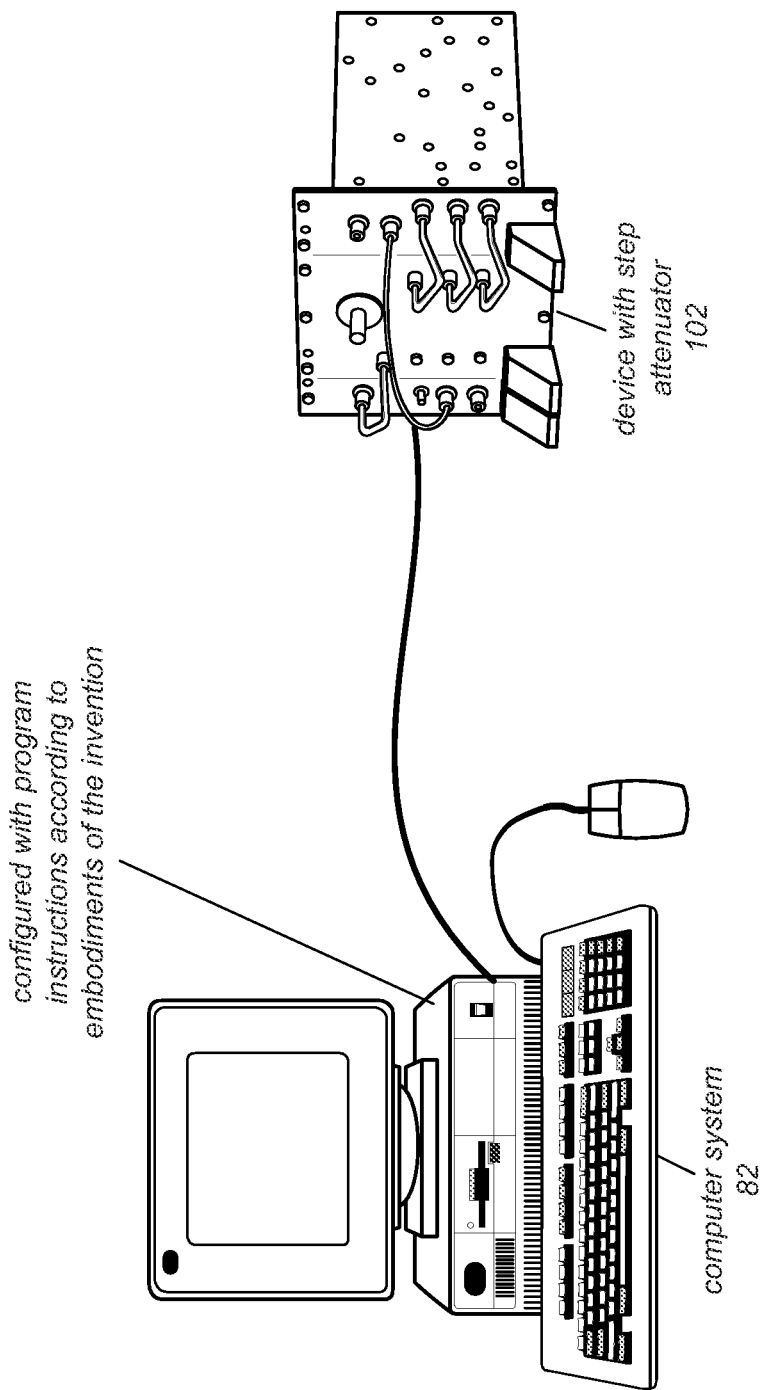
FIG. 1A illustrates an exemplary system configured to implement embodiments of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

TERMS

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DIADem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Said another way, data flow programs execute according to a data flow model of computation under which program functions are scheduled for execution in response to their necessary input data becoming available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Attenuation Measurement—refers to a process by which a numerical value representing reduction in amplitude or intensity ("loss") of a signal traversing a device, or a cascade of devices is ascertained, or to a particular numerical value so determined. Attenuation as a numeric value is commonly represented in either linear or logarithmic (dB) units. For devices with linear responses, the combined attenuation for a cascade of devices can be calculated as the product of attenuation values of the individual devices expressed in linear units, or as the sum of values expressed in dB.

FIG. 1A—Computer System

FIG. 1A illustrates an exemplary system configured to implement embodiments of the techniques disclosed herein. As shown, this exemplary system includes a computer system 82 coupled to a device 102 that includes a step attenuator. The computer system 82 may store program instructions executable to calibrate the step attenuator according to the techniques disclosed herein. One embodiment of a method for calibrating step attenuators is described below.

As shown in FIG. 1A, the computer system 82 may include a display device configured to display a graphical user interface, e.g., a front panel, whereby a user may control or monitor the calibration process. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more graphical programs which are executable to perform the methods described herein. Additionally, the memory medium may store a graphical programming development environment application used to create and/or execute such graphical programs, such as the LabVIEW™ graphical program development environment provided by National Instruments Corporation. Of course, in other embodiments, any kind of programs may be used as desired, e.g., textual programs, graphical programs, or combinations thereof. The memory medium may also store operating system software, as well as other software for operation of the computer system. Various embodiments further include receiving or storing instructions and/or data implemented in accordance with the foregoing description upon a carrier medium.

Figure 1B:
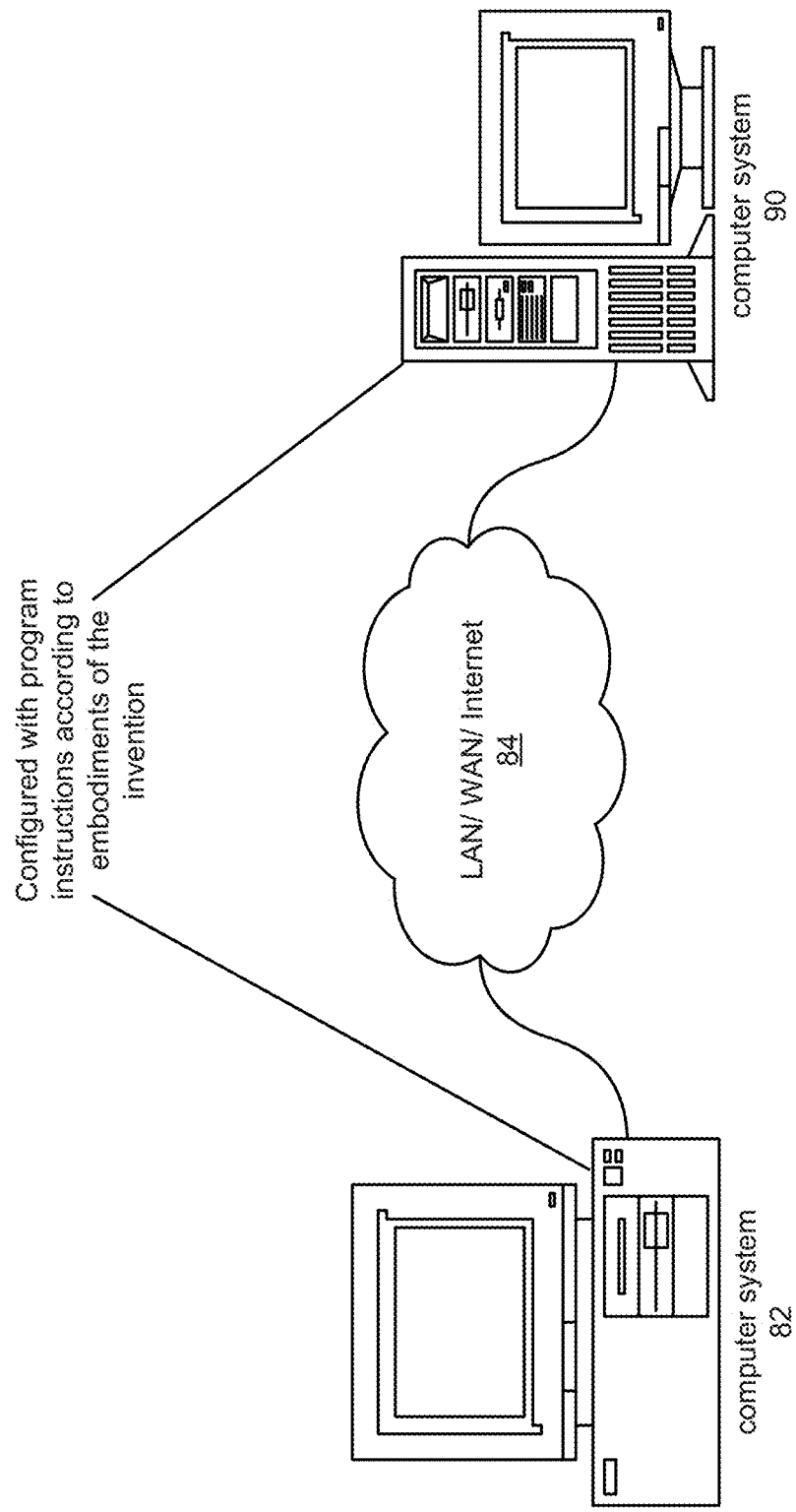
FIG. 1B illustrates a network system comprising two or more computer systems configured to implement embodiments of the present invention.

FIG. 1B—Computer Network

FIG. 1B illustrates another exemplary system configured to implement embodiments of the present invention, where the system includes a first computer system 82 coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others.

The two computers of FIG. 1B may operate in conjunction to implement embodiments of the techniques disclosed herein. For example, in one embodiment, the second computer 90 may store or acquire measurement data from an attenuating device, where the device is or includes a step attenuator e.g., device 102, and provide the measurement data to the first computer 82, which may use the data to calibrate the step attenuator, as described in more detail below.

In some embodiments, the computer systems 82 and 90 may execute a (possibly graphical) program in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the graphical program may be displayed on a display device of the computer system 82, and the block diagram may execute on a device coupled to the computer system 82. The device may include a programmable hardware element and/or may include a processor and memory medium which may execute a real time operating system. In one embodiment, the graphical program may be downloaded and executed on the device. For example, an application development environment with which the graphical program is associated may provide support for downloading a graphical program for execution on the device in a real time system.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
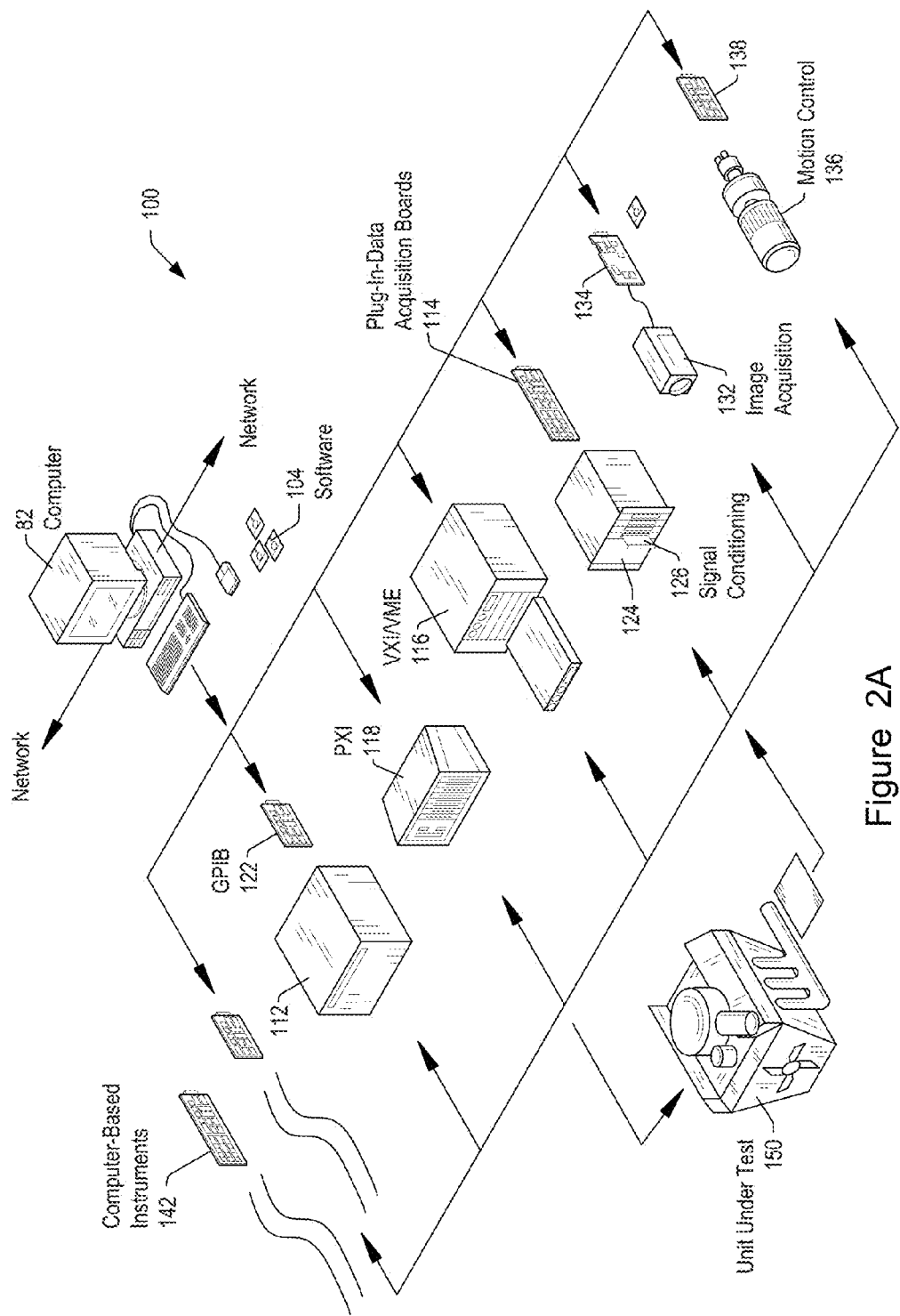
FIG. 2A illustrates an instrumentation control system according to one embodiment of the invention.

FIG. 2A illustrates an exemplary instrumentation control system 100 which may implement embodiments of the invention. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150, e.g., via execution of software 104.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
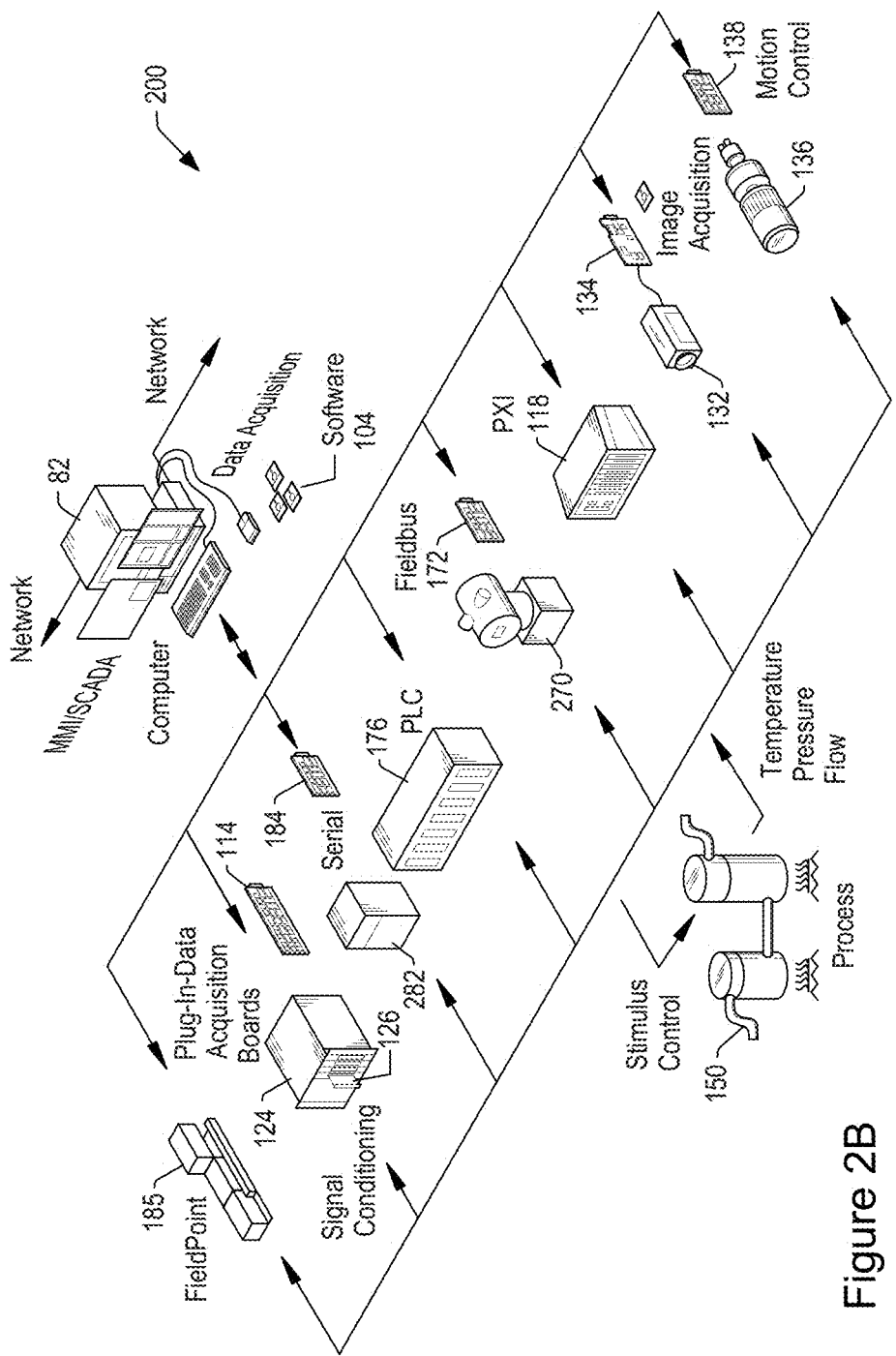
FIG. 2B illustrates an industrial automation system according to one embodiment of the invention.

FIG. 2B illustrates an exemplary industrial automation system 200 which may implement embodiments of the invention. The industrial automation system 200 is similar to the instrumentation or test and measurement system 100 shown in FIG. 2A. Elements which are similar or identical to elements in FIG. 2A have the same reference numerals for convenience. The system 200 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others, e.g., via execution of software 104.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 270 and associated fieldbus interface card 172, a PLC (Programmable Logic Controller) 176, a serial instrument 282 and associated serial interface card 184, or a distributed data acquisition system, such as Fieldpoint system 185, available from National Instruments Corporation, among other types of devices.

Figure 3A:
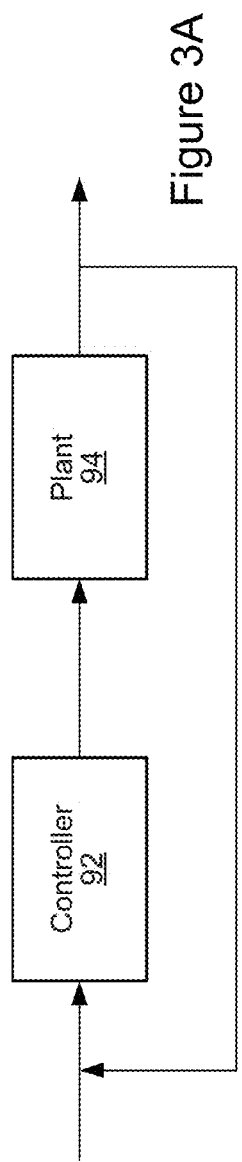
FIG. 3A is a high level block diagram of an exemplary system which may utilize embodiments of the invention.

FIG. 3A is a high level block diagram of an exemplary system which may execute or utilize graphical programs.

FIG. 3A illustrates a general high-level block diagram of a generic control and/or simulation system which comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a graphical program that specifies or implements the functionality of one or both of the controller 92 and the plant 94. For example, a control engineer may use a modeling and simulation tool to create a model (graphical program) of the plant 94 and/or to create the algorithm (graphical program) for the controller 92.

Figure 3B:
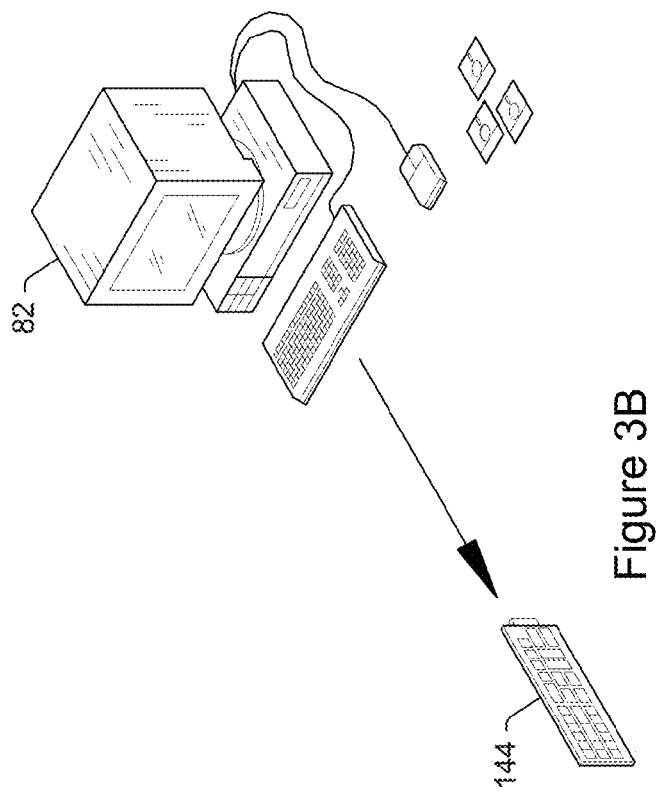
FIG. 3B illustrates an exemplary system which may perform control and/or simulation functions utilizing embodiments of the invention.

FIG. 3B illustrates an exemplary system which may perform control and/or simulation functions. As shown, the controller 92 may be implemented by a computer system 82 or other device (e.g., including a processor and memory medium and/or including a programmable hardware element) that executes or implements a (possibly graphical) program. In a similar manner, the plant 94 may be implemented by a computer system or other device 144 (e.g., including a processor and memory medium and/or including a programmable hardware element) that executes or implements a (possibly graphical) program, or may be implemented in or as a real physical system, e.g., a car engine.

In one embodiment of the invention, one or more programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical (or textual) program, and the graphical program may execute on the controller 92, e.g., on a computer system or other device. The computer system 82 may be a platform that supports real time execution, e.g., a device including a processor that executes a real time operating system (RTOS), or a device including a programmable hardware element.

In one embodiment of the invention, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In one embodiment, the user operates to select a target device from a plurality of possible target devices for programming or configuration using a graphical program. Thus the user may create a graphical program on a computer and use (execute) the graphical program on that computer or deploy the graphical program to a target device (for remote execution on the target device) that is remotely located from the computer and coupled to the computer through a network.

Graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 4:
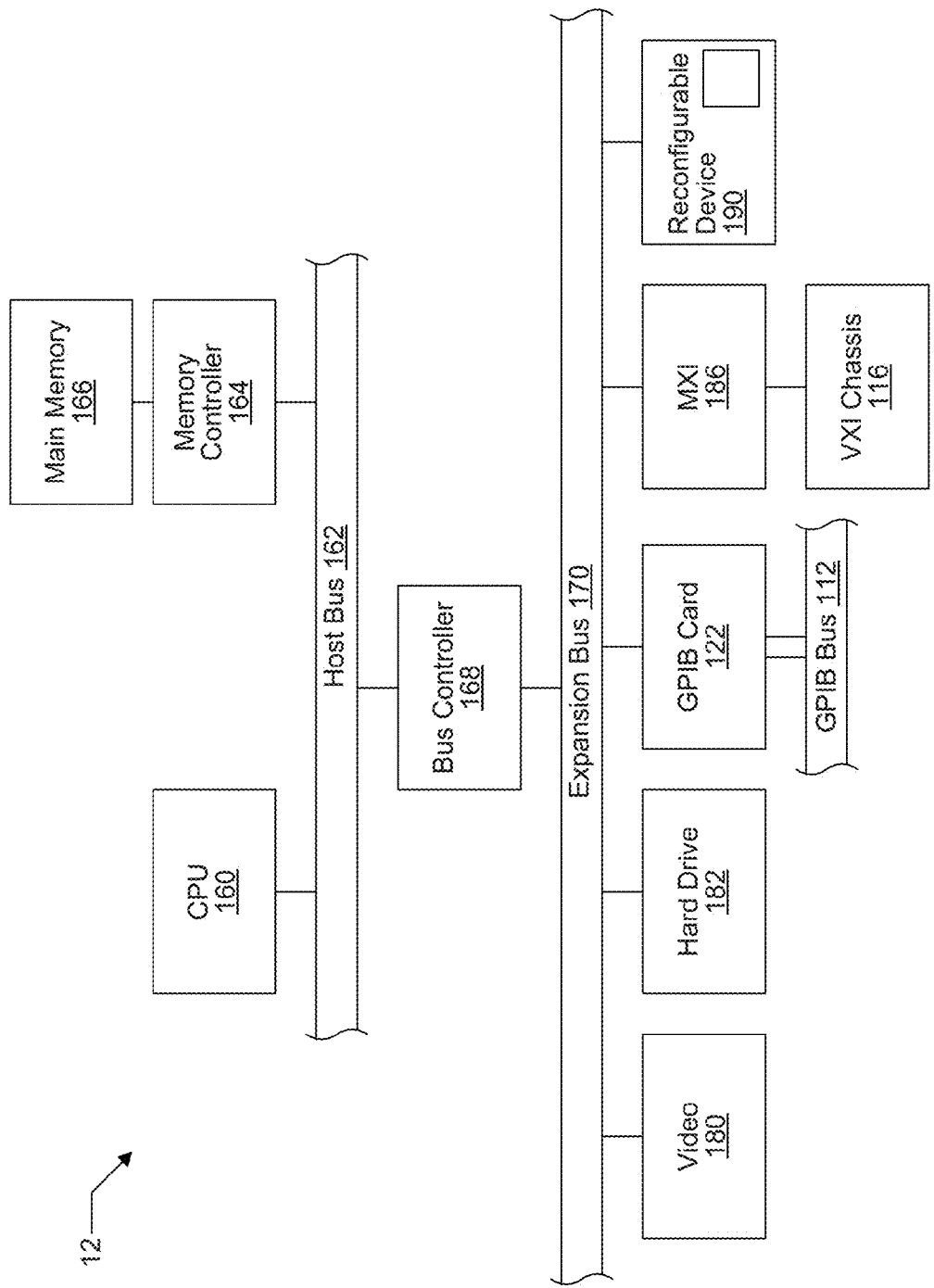
FIG. 4 is an exemplary block diagram of the computer systems of FIGS. 1A, 1B, 2A and 2B and 3B.

FIG. 4—Computer System Block Diagram

FIG. 4 is a block diagram 12 representing one embodiment of the computer system 82 and/or 90 illustrated in FIGS. 1A and 1B, or computer system 82 shown in FIG. 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store the graphical (and/or textual) program(s) configured to implement embodiments of the present techniques. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a programmable hardware element. The computer system may be configured to deploy a graphical program to the device 190 for execution of the graphical program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program.

Overview

Embodiments of the techniques disclosed herein may provide for determination of attenuator loss for attenuation steps of a step attenuator, using measurements on only a carefully selected subset of attenuation steps, while providing comparable or improved accuracy in a fraction of the time required by traditional (prior art) approaches. More specifically, a matrix least-squares estimating technique may be used to improve accuracy, while simultaneously reducing the time required to perform a frequency response calibration, e.g., a downconverter frequency response calibration, of a step attenuator across multiple step attenuator settings.

More detailed embodiments are presented below.

Figure 5:
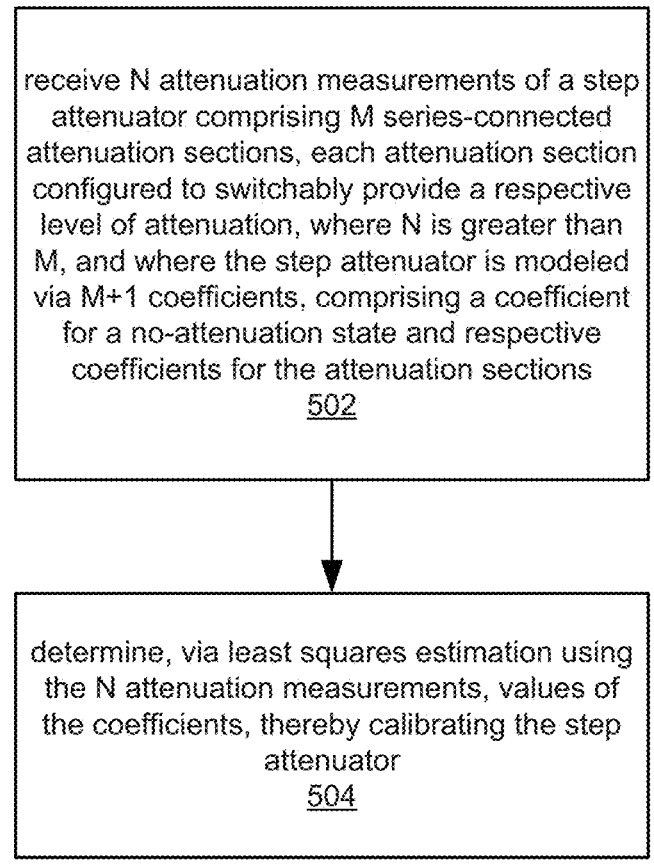
FIG. 5 is a flowchart diagram illustrating one embodiment of a method for calibrating a step attenuator.

FIG. 5—Flowchart of a Method for Calibrating a Step Attenuator

FIG. 5 illustrates a method for calibrating a step attenuator, according to one embodiment. The method shown in FIG. 5 may be used in conjunction with any of the computer systems or devices shown in the above Figures, among other devices. For example, the method of FIG. 5 may be performed by host computer, or by the device, e.g., a microwave signal generator, spectrum analyzer, etc., that includes the step attenuator itself. In various embodiments, some of the method elements shown may be performed concurrently, in a different order than shown, or may be omitted. Additional method elements may also be performed as desired. As shown, this method may operate as follows.

In 502, N attenuation measurements of a step attenuator may be received. The step attenuator may include M series-connected attenuation sections, where each attenuation section is configured to switchably provide a respective level of attenuation (of a signal). Note that N and M are integers, and that N is greater than M. In other words, for a given number of attenuation steps in the step attenuator, a greater number of measurements are received. Note further that the labels used herein, e.g., "N", "M", "k", "b", etc., may be referred to via any other labels as desired; the particular letters and references used are for convenience and convention only.

The step attenuator may be modeled via M+1 coefficients, including a coefficient for a no-attenuation state and respective coefficients for the attenuation sections. The no-attention state refers to the state in which all the attenuation steps are inactive, e.g., are turned off. Note that in general this state still provides some attenuation, specifically, the minimum level that is inherent to the step attenuator and/or the device that includes the step attenuator.

Further details regarding an exemplary step attenuator are presented below.

As FIG. 5 indicates, in 504, values of the coefficients may be determined via least squares estimation using the N attenuation measurements, thereby calibrating the step attenuator. Said another way, having at least as many attenuation measurements as there are coefficients allows the method to determine values of the coefficients based on the attenuation measurements. Determining these coefficient values may thus calibrate the step attenuator (at least for a given frequency).

In some embodiments, the receiving (502) and determining (504) may be performed for a respective input signal at each frequency of a plurality of frequencies. In other words, the receiving and determining may be performed for each of multiple frequencies to calibrate the step attenuator over a range of frequencies, e.g., over the operational frequency range of the step attenuator (and/or device that contains the step attenuator).

Further Exemplary Embodiments

The following describes various further exemplary embodiments, although it should be noted that the particular embodiments described are exemplary only, and are not intended to limit the embodiments to any particular form, function, or appearance.

Figure 6:
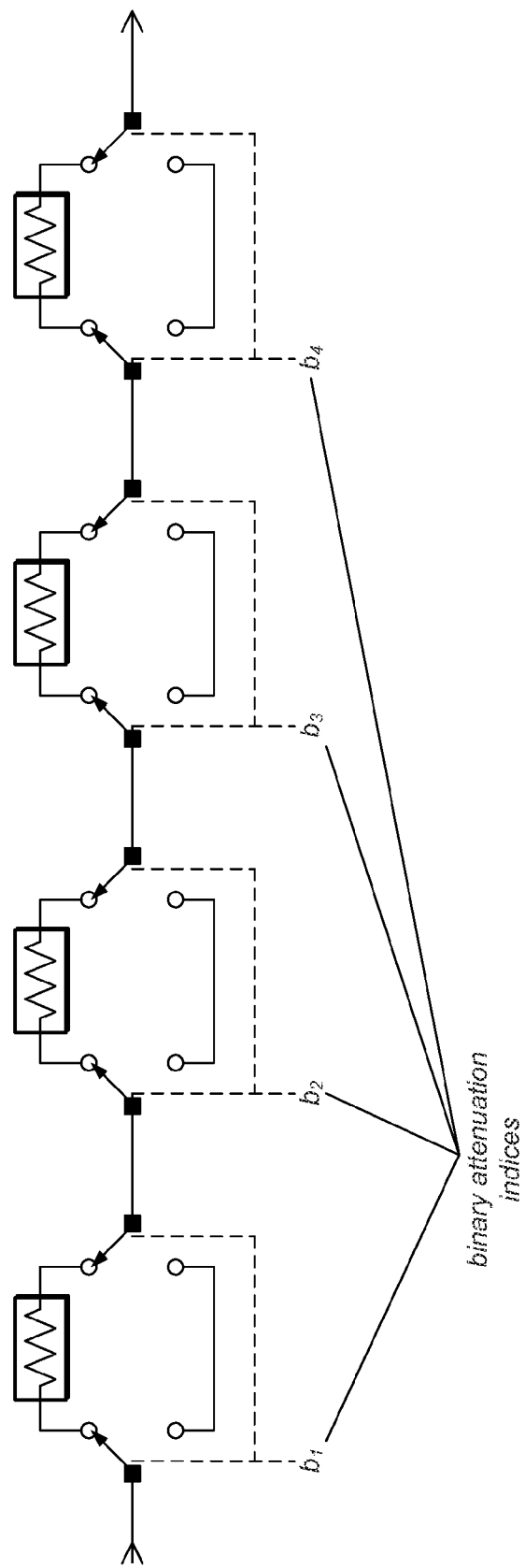
FIG. 6 is a high level diagram of an exemplary step attenuator, according to one embodiment.

Turning now to FIG. 6, a high level diagram of an exemplary step attenuator, according to one embodiment, is shown. Note that the exemplary step attenuator shown has four attenuation steps, but that in other embodiments any number of attenuation steps may be used as desired. More generally, any of various types of step attenuator may be calibrated using embodiments of the techniques disclosed herein, e.g., both mechanical and solid-state step attenuators. The particular step attenuator shown uses mechanical contacts but is actuated electronically using solenoids. Other attenuators contemplated may be entirely solid state, mechanical, electrical, or electronic, devices, and/or any of various combinations of electrical, electronic, mechanical, and/or solid state elements or components, among others.

The exemplary step attenuator of FIG. 6, an embodiment of which may be used in the PXIE-5606 downconverter provided by National Instruments Corporation, includes four series connected switchable attenuation sections (or steps) that are individually controllable (via the binary control index). The nominal attenuations for the sections are 5 dB, 10 dB, 20 dB, and 40 dB, allowing a total attenuation range of 0-75 dB in 5 dB steps.

More specifically, in the particular embodiment of the attenuator of FIG. 6, the respective sections may be engaged by discrete digital signals which when taken together may form a 4-bit binary control word (or binary attenuation index), where bit-1 controls the 5 dB section, bit-2 controls the 10 dB section, bit-3 controls the 20 dB section, and bit-4 controls the 40 dB section. The nominal attenuation for a given index is therefore L(index)=index*5 dB. At index=0 (b0000) the nominal attenuation is 0 dB, at index 1 (b0001) 5 dB, up to 75 dB at the maximum index of 15 (b1111).

More generally, in some embodiments, the step attenuator may be controlled by an M-bit binary control index, where each bit is a respective binary (two-valued, e.g., zero or one) attenuation index, and where M binary attenuation indices, e.g., $b_1$-$b_M$, respectively control the M attenuation sections. In some embodiments, the binary control index may be implemented as an M-bit "word", although in other embodiments, any data structure or representation may be used as desired. Each bit (or binary attenuation index) may control a respective attenuation step, as illustrated in FIG. 6, where $b_1$ controls the first attenuation step, $b_2$ controls the second attenuation step, and so forth. In other words, $b_1 \ldots b_4$ represent the four individual bits in a binary representation of the index (where bit values are either 0 or 1), the coefficients $k_1 \ldots k_4$ represent the change in signal loss when the sections or steps are individually activated (in dB), and $k_0$ represents the signal loss of the no-attenuation (index=0) state. Note that in this exemplary case, the number of attenuation measurements N is at least 5.

Accordingly, in one embodiment, the method may include modeling the step attenuator as a linear combination of attenuation terms for the respective attenuation sections or steps, e.g.:

$$L(\text{index}) = k_0 + k_1 * b_1 + k_2 * b_2 k_M * b_M,$$

where $k_0$-$k_M$ are the M+1 coefficients, and L represents an attenuation measurement. This expression may be expressed more compactly as:

$$\text{vector } b * \text{vector } k = \text{vector } L.$$

Thus, the (modeled) contribution of each attenuation step is represented as a product of the respective binary control index and the corresponding coefficient, where a binary control index value of zero nullifies the product, and a value of one results in a step attenuation value of the respective coefficient. As explained above, the coefficient $k_0$ represents the inherent or residual attenuation in effect when all of the attenuation steps are inactive, e.g., the "zero state". Thus, when all the binary control indices are zero, L is equal to $k_0$. In other words, $k_0$ represents the inherent attenuation of the zero state.

In some embodiments, determining the values of the coefficients may include solving a system of linear equations defined by an augmented control matrix, a coefficient vector k, and a measured attenuation vector L, e.g.:

$$\begin{bmatrix} 1 & b_{01} & b_{02} & \ldots & b_{0M} \\ 1 & b_{11} & \ldots & \ldots & b_{1M} \\ \ldots & \ldots & \ldots & \ldots & \ldots \\ \ldots & \ldots & \ldots & \ldots & \ldots \\ 1 & b_{N1} & b_{N2} & \ldots & b_{NM} \end{bmatrix} \begin{bmatrix} k_0 \\ k_1 \\ \ldots \\ \ldots \\ k_M \end{bmatrix} = \begin{bmatrix} L_0 \\ L_1 \\ \ldots \\ \ldots \\ L_N \end{bmatrix},$$

where each matrix row specifies a respective activation pattern of the attenuation sections, where at least M+1 of the linear equations are linearly independent, and where $L_i$ is a respective attenuation measurement, i.e., measured "loss" value, M is the number of attenuator steps or stages, and N is the number of measurements. Said another way:

matrix $b_{MN}$*vector $k_M$=vector $L_N$.

The term "augmented" refers to the leftmost column of the control matrix, whose values are all 1, and which corresponds to the zero state attenuation contribution of each activation pattern. Note, for example, that for each activation pattern (row), setting all the control bits to zero (or off) results in the expression $k_0=L_0$, as noted above.

Following the exemplary use case of FIG. 6, the four control bits allow 16 individual states (activation states) of the step attenuator, each state corresponding to a respective pattern of the bit values, and the attenuation L at each of these states can be measured. Now, in the case of the four-step attenuator of FIG. 6, there are five unknown coefficients k0 . . . k4—one for each bit, and one for the zero state, as mentioned above, so a minimum of five measurements are needed to solve for the coefficients. When more than five measurements are used, the system of equations is over-determined.

More generally, when N is greater than M+1, the system of linear equations is over-determined. In other words, when more measurements are used, the number of rows in the matrix and L vector may increase accordingly. Note that with only M+1 (e.g., five in the present example) measurements, b is a square matrix and may potentially be inverted directly, giving a solution as vector $k=b^{-1}*L$, but if additional measurements are made, there are more measurements than unknowns, b is no longer a square matrix, $b^{-1}$ is undefined and the system is over-determined. However, the same equations that solve the least-squares solution for the over-determined system still work if the number of measurements is reduced to the minimum of 5.

In one embodiment, the least-squares solution for the system of equations may be found as follows:

matrix $b$*vector $k$=vector $L$, (matrix $b^T$*matrix $b$)*vector $k$=(matrix $b^T$)*vector $L$, vector $k$=(matrix $b^T$*matrix $b$)$^{-1}$*(matrix $b^T$)*vector $L$, where superscript T denotes "transpose" of the matrix.

As noted above with reference to the method of FIG. 5, since the attenuator section's loss are generally not constant as a function of frequency, in some embodiments, the k vector values may be calculated for each discrete frequency at which calibration data (measured L values) is collected. In other words, the receiving (502) and determining (504) may be performed for each of multiple frequencies to calibrate the step attenuator over a range of frequencies, e.g., over the operational frequency range of the step attenuator (and/or device that contains the step attenuator).

Note, however, that the value of the matrix "(matrix $b^T$*matrix $b$)$^{-1}$*(matrix $b^T$)" is constant for a particular set of measured attenuation states. The coefficients at each new frequency may thus be determined by multiplying each new vector of measured data L, by the already calculated "(matrix $b^T$*matrix $b$)$^{-1}$*(matrix $b^T$)", providing for efficient computation. Additional computational optimization may be obtained for a given "(matrix $b^T$*matrix $b$)$^{-1}$*(matrix $b^T$)" if so desired, e.g., by "unrolling" the matrix multiplication into its component values and omitting the products where the $b_{ij}$ values are zero. This optimization may need to be customized for any particular set of measured states, but may provide for fastest execution by eliminating unnecessary multiplication and addition instructions.

Note that while the above discussion has tacitly presumed that the measured L values are attenuator loss, the measurements that can actually be accessed during calibration may not be simply the step attenuator's loss, but may instead be the loss or attenuation of an entire device in which the step attenuator is included, e.g., may reflect the entire device's, e.g., a downconverter's, response.

Note that the above model still applies in the same way, but the value of the vector L represents the complete device (e.g., downconverter) response, not just the step attenuator. The additional response attributable to other parts of the device (including any inherent losses of the step attenuator in the zero state) simply gets incorporated into the value of $k_0$.

Thus, in some embodiments, the step attenuator may be included in a device, where $L_i$ is a respective attenuation measurement for the device, including the step attenuator.

Sub-Sampling

In various embodiments of the above techniques, any number of measurements>=M+1 (e.g., greater than or equal to 5, in the exemplary case described) may suffice, depending upon the chosen states. However, poorly chosen combinations of attenuation states may result in an ill-conditioned system and no (good) solution. Accordingly, particular activation states used may be chosen such that this is not the case. Said another way, activation patterns may be selected to produce a well-conditioned matrix.

Referring again to the exemplary case above, since the system of equations is over-determined with more than 5 measurements, some of the possible activation states may be omitted (e.g., from the measurements). This may be advantageous from at least two perspectives: first, for low attenuation values, especially at 0 dB, but also to some degree at 5 dB, there may be significant microwave mismatch (and therefore increased measurement uncertainty) resulting from mediocre input return loss (RL), e.g., of a first mixer interacting with the signal source used for calibration, and so omitting the low attenuation states may reduce the impact of the mixer RL; second, at very high attenuation, the signal level available, e.g., at a digitizer, is low, and so considerable averaging (and therefore time) may be needed to reduce noise and achieve acceptable accuracy. Accordingly, omitting measurements at the 0, 5, 65, 70, and 75 dB settings therefore may have the potential to both reduce test time, and at the same time increase the accuracy of the calibration, a rare example of doing less to get better results.

More generally, in some embodiments, the step attenuator may be configurable to provide a range of attenuation values, where the attenuation measurements are made at respective attenuation values of the step attenuator within a specified sub-range of the range. For example, in one embodiment, the sub-range may omit at least one lowest value of the range. In another embodiment, the sub-range may omit at least one highest value of the range. Of course, in further embodiments, the sub-range may omit one or more values at both the lowest and highest values of the range.

FIGS. 7-10—Exemplary Results

The following presents exemplary modeled and measured data illustrating benefits of the above techniques in the particular case of an actual (exemplary) downconverter that includes the exemplary step attenuator of FIG. 6.

Figure 7:
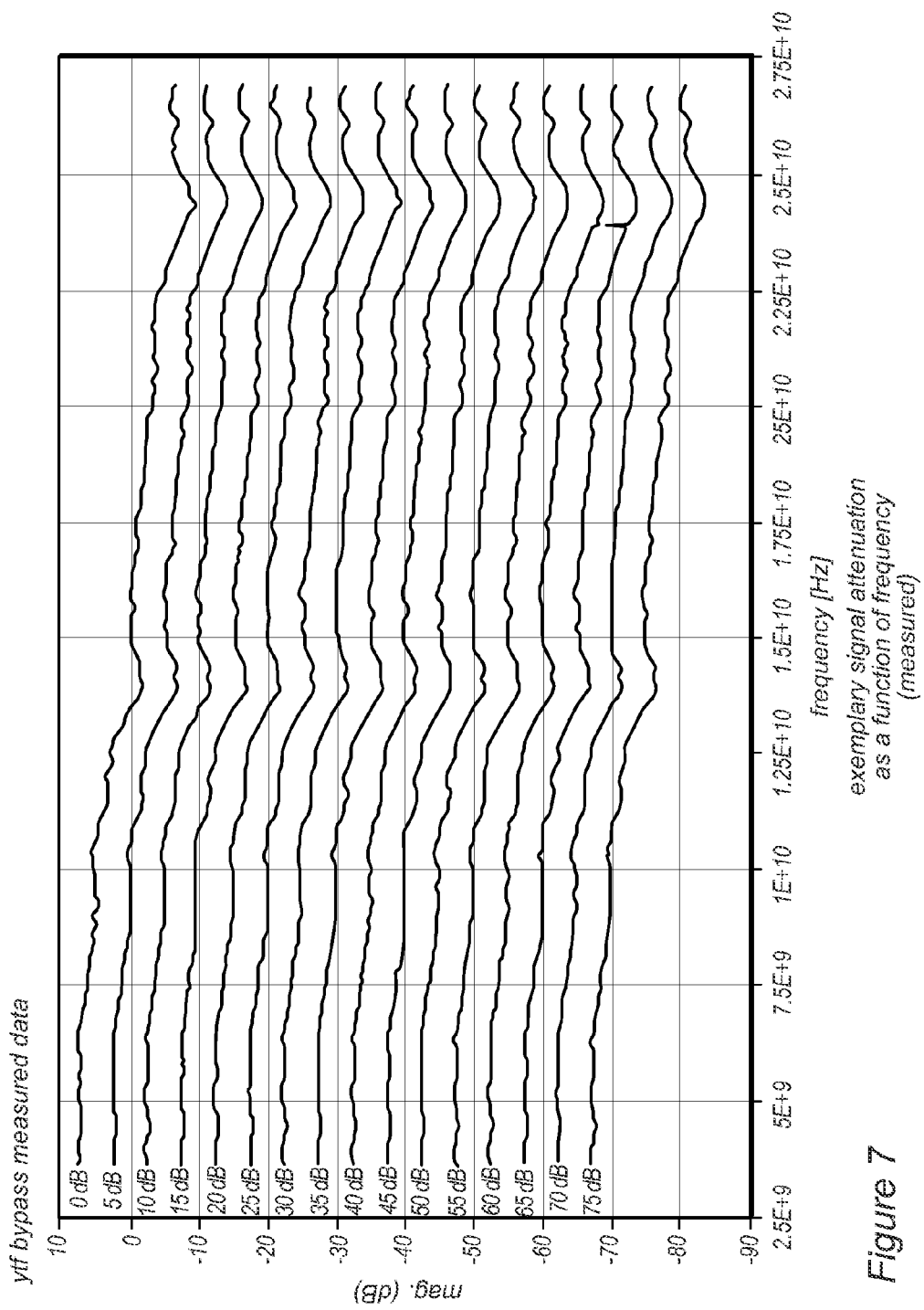
FIG. 7 illustrates exemplary measured signal attenuation as a function of frequency, according to one embodiment.

FIG. 7 illustrates exemplary measured signal attenuation as a function of frequency, according to one embodiment. More specifically, FIG. 7 presents measured data for all attenuation states of the device. Note the measurement glitches at 23 GHz at 65 dB attenuation—these are a result of other factors and may be ignored as outliers.

Figure 8:
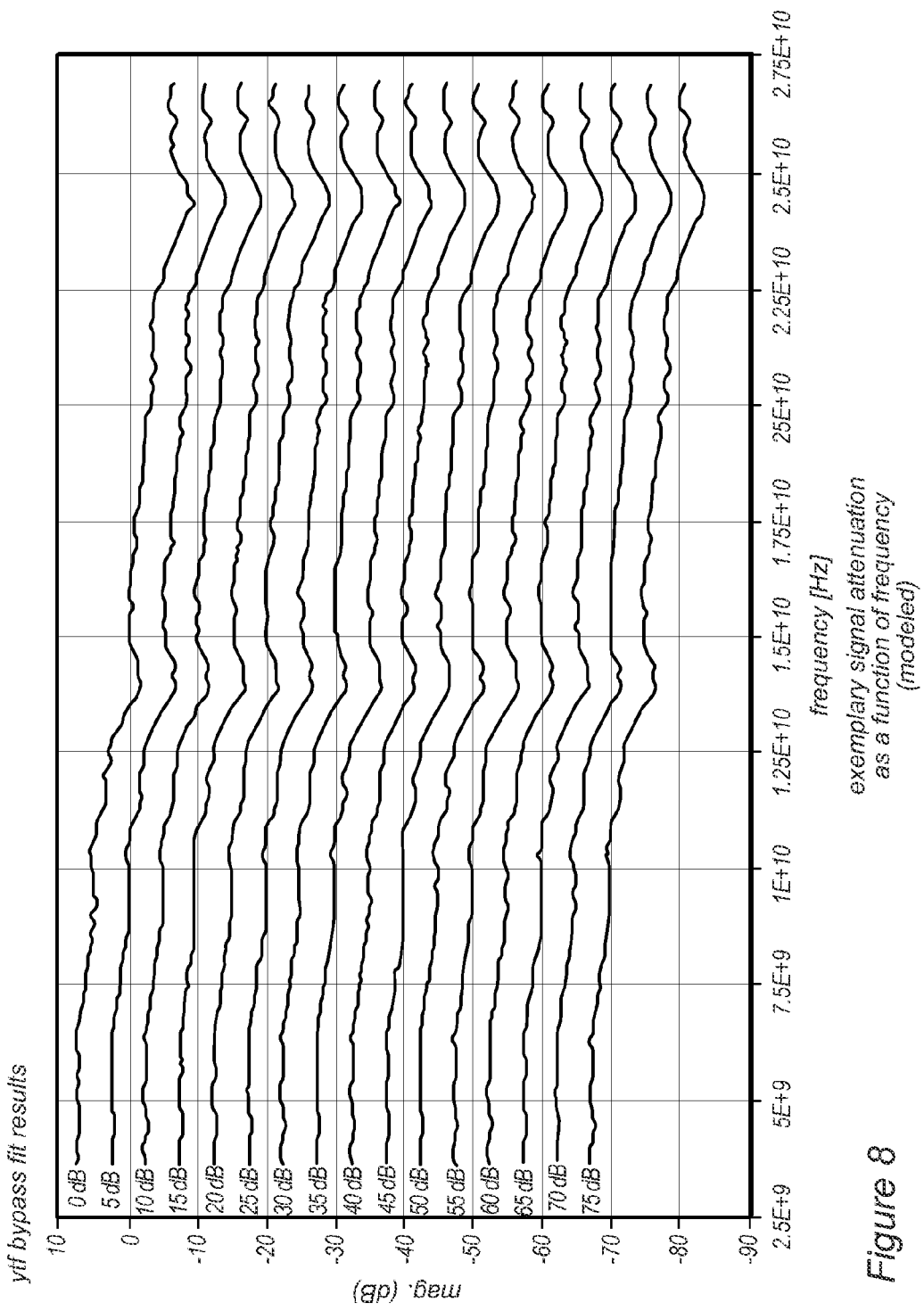
FIG. 8 illustrates exemplary modeled signal attenuation as a function of frequency, according to one embodiment.

FIG. 8 illustrates exemplary modeled signal attenuation as a function of frequency, according to one embodiment. Note that in this figure, the model generated data using only data from 10 dB to 60 dB states.

Figure 9:
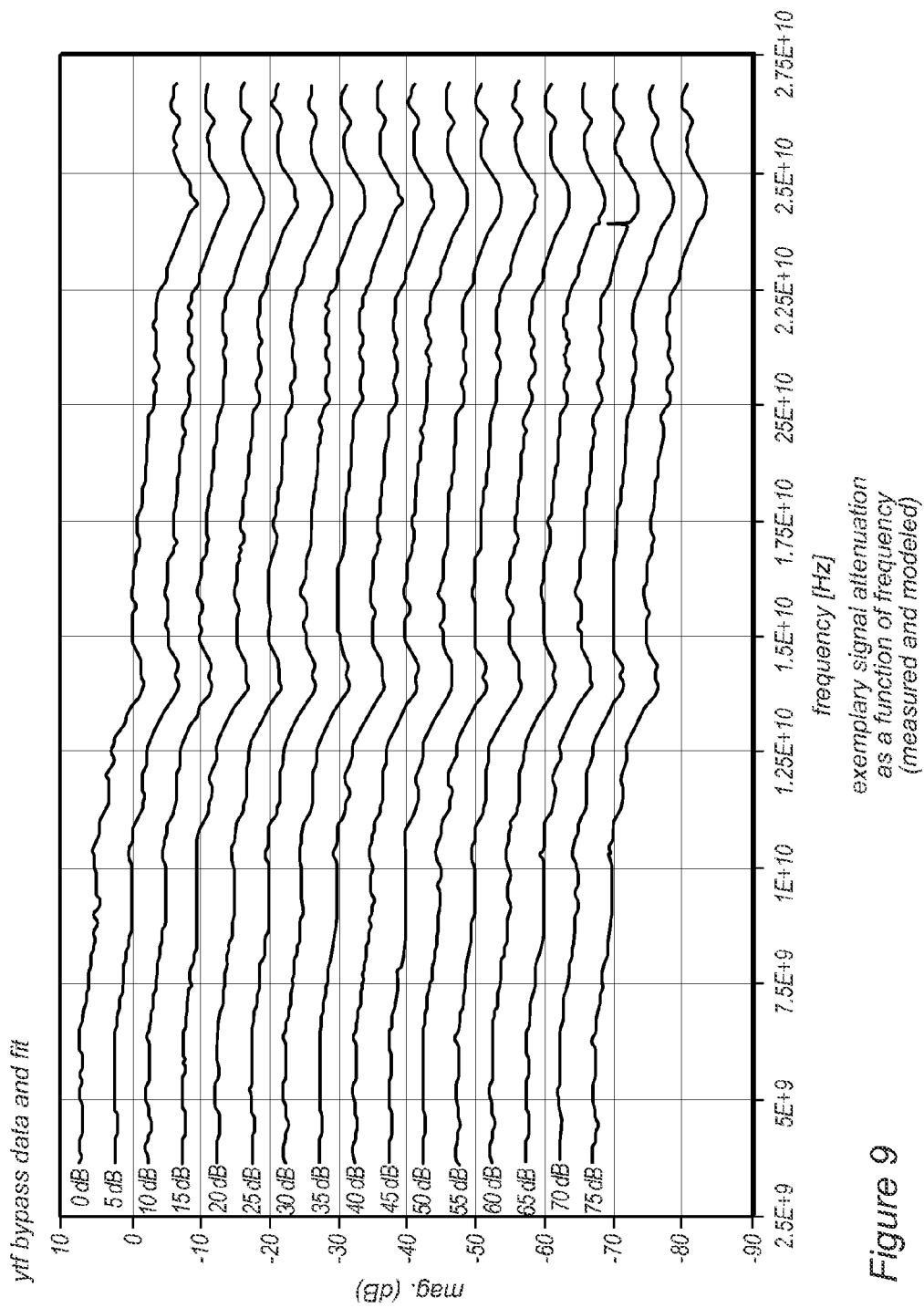
FIG. 9 illustrates exemplary measured and modeled signal attenuation as a function of frequency, according to one embodiment.

FIG. 9 illustrates exemplary measured and modeled signal attenuation as a function of frequency, according to one embodiment, i.e., presents the results of FIGS. 7 and 8 together.

Figure 10:
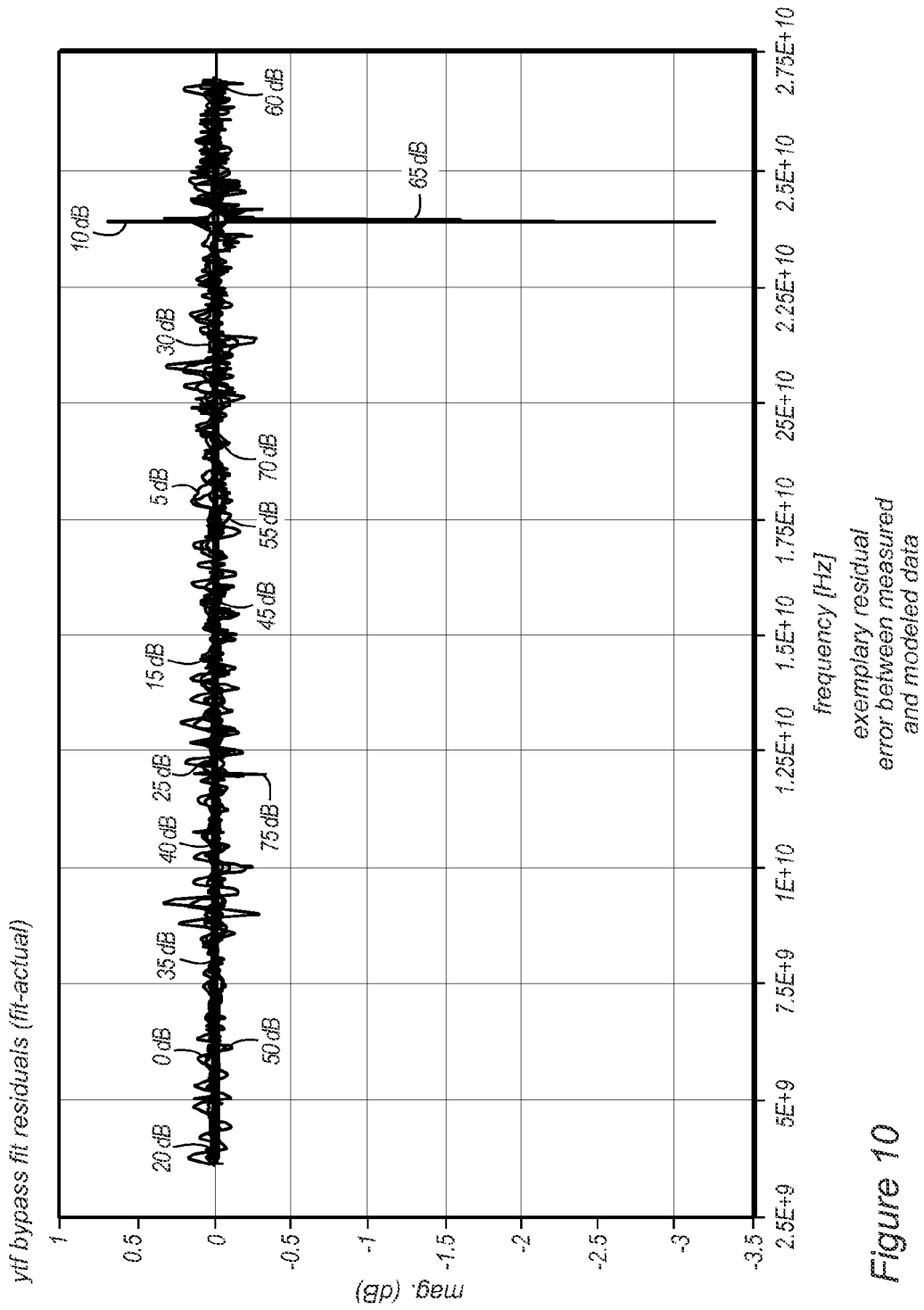
FIG. 10 illustrates exemplary residual error between measured and modeled signal attenuation as a function of frequency, according to one embodiment.

FIG. 10 illustrates exemplary residual error between the measured and modeled signal attenuation of FIGS. 7 and 8 as a function of frequency, according to one embodiment. In other words, the differences between modeled and measured attenuation values are shown. As may be seen, the residual errors resulting from comparing model data to actual measured results were insignificant (<0.1 dB) for all attenuation settings except at 0 dB and 5 dB for the units characterized. The match (return loss) at a mixer's input is typically not very good; in the exemplary downconverter used, this accounts for the ripple apparent in the residuals data shown in FIG. 10 for the 0 and 5 dB attenuation settings. As will be described below, this ripple is predominantly a result of mismatch uncertainty between the mixer and signal generator.

As also indicated, at higher attenuation settings, reflections from the mixer are attenuated significantly before they can reach the input connector (and interact with the source match), so the match of the attenuator (or other input interfaces) begins to dominate the overall downconverter input match at 10 dB or higher attenuation. Mismatch between generator and load can be characterized by both mismatch loss (ML) and mismatch uncertainty (MU). ML for the downconverter is one of the factors accounted for in the response calibration. As its name implies, MU may be unknowable; however bounding values of MU may be calculated for particular values of source and load match.

Note that if a perfectly matched (hypothetical) signal source could be employed for calibration, the mismatch uncertainty would vanish (MU=0), and the response would then only include ML from interfaces internal to the downconverter since reflected power exiting the downconverter would be completely absorbed by the perfect source. However any real signal generator generally has an imperfect match, and finite MU may result that is not separable from the ML using only scalar measurements, and may thus result in errors in the response calibration data. Employing a different signal generator, or changing the length of cable between the signal generator and the downconverter may alter the ripple pattern and a different measured response may result.

Since higher attenuation settings isolate the mixer from the generator, and therefore minimize the MU, using results measured at higher attenuation to estimate the downconverter response for the 5 dB and 0 dB attenuation settings may avoid MU that results when directly measuring those cases, but possibly at the cost of potentially not accounting for some ML specific to those settings. Because the attenuator may have an excellent match for all settings, any mismatch loss specific to the low attenuation settings may be minimal. If MU related to the mixer is larger than attenuator ML, (which is likely) the overall accuracy of the calibration may be improved for the low attenuation settings by using the model, e.g., because what little information is lost about ML may be outweighed by omitting the larger magnitude MU inherent in measuring at the low attenuation states. ML originating with the mixer input may be present regardless of the attenuator setting, and may therefore be represented in the model for all attenuations.

Accordingly, using the modeled response for low attenuation settings may effectively remove much of the mismatch uncertainty from the calibration. Note, that when the calibrated downconverter is in turn used to measure signals of interest, mismatch uncertainty between the downconverter and signal source of interest may again occur; however, the overall absolute accuracy may be improved because of the lower uncertainty in the calibration.

Exemplary Creation of a Graphical Program

The following describes exemplary creation of a graphical program, according to various embodiments. The graphical program may implement an embodiment of the techniques disclosed herein.

First, a graphical program may be created on the computer system 82 (or on a different computer system). The graphical program may be created or assembled by the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons which visually indicates the functionality of the program. As noted above, the graphical program may comprise a block diagram and may also include a user interface portion or front panel portion. Where the graphical program includes a user interface portion, the user may optionally assemble the user interface on the display. As one example, the user may use the LabVIEW™ graphical programming development environment to create the graphical program.

In an alternate embodiment, the graphical program may be created by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A non-transitory computer accessible memory medium that stores program instructions executable by a processor to implement:
receiving N attenuation measurements of a step attenuator, wherein the step attenuator comprises M series-connected attenuation sections, wherein each attenuation section is configured to be switchable to provide a respective level of attenuation, wherein N is greater than M, and wherein the step attenuator is modeled via M+1 coefficients, comprising a coefficient for a no-attenuation state and respective coefficients for the attenuation sections; and
calibrating the step attenuator, wherein calibrating the step attenuator comprises determining, via least squares estimation using the N attenuation measurements, values of the coefficients.

2. The non-transitory computer accessible memory medium of claim 1, wherein the program instructions are further executable to implement:
performing said receiving N attenuation measurements and said determining values of the coefficients for a respective input signal at each frequency of a plurality of frequencies.

3. The non-transitory computer accessible memory medium of claim 1, wherein the step attenuator is controlled by an M-bit binary control index, wherein each bit is a respective binary attenuation index, and wherein M binary attenuation indices $b_1$-$b_M$ respectively control the M attenuation sections.

4. The non-transitory computer accessible memory medium of claim 3, wherein the program instructions are further executable to implement:
modeling the step attenuator as a linear combination of attenuation terms for the respective attenuation sections, comprising:

$$L_i = k_0 + k_1 * b_1 + k_2 * b_2 + \ldots + k_M * b_M,$$

wherein $k_0$-$k_M$ are the M+1 coefficients, and $L_i$ represents an attenuation measurement of the N attenuation measurements.

5. The non-transitory computer accessible memory medium of claim 4, wherein said determining the values of the coefficients comprises solving a system of linear equations defined by an augmented control matrix, a coefficient vector k, and a measured attenuation vector $L_{i=0 \ldots N}$, comprising:

$$\begin{bmatrix} 1 & b_{01} & b_{02} & \ldots & b_{0M} \\ 1 & b_{11} & \ldots & \ldots & b_{1M} \\ \ldots & \ldots & \ldots & \ldots & \ldots \\ \ldots & \ldots & \ldots & \ldots & \ldots \\ 1 & b_{N1} & b_{N2} & \ldots & b_{NM} \end{bmatrix} \begin{bmatrix} k_0 \\ k_1 \\ \ldots \\ \ldots \\ k_M \end{bmatrix} = \begin{bmatrix} L_0 \\ L_1 \\ \ldots \\ \ldots \\ L_N \end{bmatrix},$$

wherein each matrix row specifies a respective activation pattern of the attenuation sections, wherein at least M+1 of the linear equations are linearly independent, and wherein $L_i$ is a respective attenuation measurement of the attenuation vector.

6. The non-transitory computer accessible memory medium of claim 5, wherein the step attenuator is comprised in a device, wherein $L_i$ is a respective attenuation measurement for the device, including the step attenuator.

7. The non-transitory computer accessible memory medium of claim 5, wherein N is greater than M+1, and wherein the system of linear equations is over-determined.

8. The non-transitory computer accessible memory medium of claim 1, wherein the step attenuator is configurable to provide a range of attenuation values, wherein the attenuation measurements are made at respective attenuation values of the step attenuator within a specified sub-range of the range.

9. The non-transitory computer accessible memory medium of claim 8, wherein the sub-range omits at least one lowest value of the range.

10. The non-transitory computer accessible memory medium of claim 8, wherein the sub-range omits at least one highest value of the range.

11. A computer-implemented method for calibrating a step attenuator, comprising:
utilizing a computer to perform:
receiving N attenuation measurements of a step attenuator, wherein the step attenuator comprises M series-connected attenuation sections, wherein each attenuation section is configured to be switchable to provide a respective level of attenuation, wherein N is greater than M, and wherein the step attenuator is modeled via M+1 coefficients, comprising a coefficient for a no-attenuation state and respective coefficients for the attenuation sections; and
calibrating the step attenuator, wherein calibrating the step attenuator comprises determining, via least squares estimation using the N attenuation measurements, values of the coefficients.

12. The computer-implemented method of claim 11, further comprising:
performing said receiving N attenuation measurements and said determining values of the coefficients for a respective input signal at each frequency of a plurality of frequencies.

13. The computer-implemented method of claim 11, wherein the step attenuator is controlled by an M-bit binary control index, wherein each bit is a respective binary attenuation index, and wherein M binary attenuation indices $b_1$-$b_M$ respectively control the M attenuation sections.

14. The computer-implemented method of claim 13, wherein the program instructions are further executable to:
model the step attenuator as a linear combination of attenuation terms for the respective attenuation sections, comprising:

$$L_i = k_0 + k_1 * b_1 + k_2 * b_2 + \ldots + k_M * b_M,$$

wherein $k_0$-$k_M$ are the M+1 coefficients, and $L_i$ represents an attenuation measurement of the N attenuation measurements.

15. The computer-implemented method of claim 14, wherein said determining the values of the coefficients comprises solving a system of linear equations defined by an augmented control matrix, a coefficient vector k, and a measured attenuation vector $L_{i=0 \ldots N}$, comprising:

$$\begin{bmatrix} 1 & b_{01} & b_{02} & \ldots & b_{0M} \\ 1 & b_{11} & \ldots & \ldots & b_{1M} \\ \ldots & \ldots & \ldots & \ldots & \ldots \\ \ldots & \ldots & \ldots & \ldots & \ldots \\ 1 & b_{N1} & b_{N2} & \ldots & b_{NM} \end{bmatrix} \begin{bmatrix} k_0 \\ k_1 \\ \ldots \\ \ldots \\ k_M \end{bmatrix} = \begin{bmatrix} L_0 \\ L_1 \\ \ldots \\ \ldots \\ L_N \end{bmatrix}$$

wherein each matrix row specifies a respective activation pattern of the attenuation sections, wherein at least M+1 of the linear equations are linearly independent, and wherein $L_i$ is a respective attenuation measurement of the attenuation vector.

16. The computer-implemented method of claim 15, wherein the step attenuator is comprised in a device, wherein $L_i$ is a respective attenuation measurement for the device, including the step attenuator.

17. The computer-implemented method of claim 15, wherein N is greater than M+1, and wherein the system of linear equations is over-determined.

18. The computer-implemented method of claim 11, wherein the step attenuator is configurable to provide a range of attenuation values, wherein the attenuation measurements are made at respective attenuation values of the step attenuator within a specified sub-range of the range.

19. The computer-implemented method of claim 18, wherein the sub-range omits at least one lowest value of the range.

20. The computer-implemented method of claim 18, wherein the sub-range omits at least one highest value of the range.

* * * * *